United States Patent [19]

Thomas et al.

[11] 4,318,013
[45] Mar. 2, 1982

[54] HIGH VOLTAGE DETECTION CIRCUIT

[75] Inventors: James S. Thomas, Manor; Kim Eckert, Austin, both of Tex.

[73] Assignee: Motorola, Inc., Schaumburg, Ill.

[21] Appl. No.: 35,042

[22] Filed: May 1, 1979

[51] Int. Cl.$^3$ .................. H03K 5/24; H03K 17/30; H03K 17/687
[52] U.S. Cl. .................. 307/362; 307/450; 307/581
[58] Field of Search ............ 307/205, 208, 251, 270, 307/304, 350, 362, 363, DIG. 4, 448, 450, 581, 584

[56] References Cited

U.S. PATENT DOCUMENTS

| | | | |
|---|---|---|---|
| 3,628,070 | 12/1971 | Heuner et al. | 307/362 X |
| 3,898,479 | 8/1975 | Proebsting | 307/DIG. 4 X |
| 4,008,406 | 2/1977 | Kawagde | 307/297 X |
| 4,061,933 | 12/1977 | Schroeder et al. | 307/DIG. 4 X |
| 4,071,783 | 1/1978 | Knepper | 307/DIG. 4 X |
| 4,122,361 | 10/1978 | Clemen et al. | 307/DIG. 4 X |
| 4,129,794 | 12/1978 | Dickson et al. | 307/DIG. 4 X |
| 4,176,289 | 11/1979 | Leach et al. | 307/DIG. 4 X |
| 4,219,743 | 8/1980 | Millns | 307/DIG. 4 X |

FOREIGN PATENT DOCUMENTS 2340770 2/1975 Fed. Rep. of Germany ... 307/DIG. 4

OTHER PUBLICATIONS

Harroun, *IBM Technical Disclosure Bulletin*, vol. 20, No. 7, pp. 2603–2605; 12/1977.
Chu et al., *IBM Technical Disclosure Bulletin*, vol. 18, No. 3; 8/1975, pp. 710–711.
Danielski et al., *IBM Techanical Disclosure Bulletin*, vol. 18, No. 4, pp. 1033–1034; 9/1975.

*Primary Examiner*—Larry N. Anagnos
*Attorney, Agent, or Firm*—Anthony J. Sarli, Jr.; Jeffrey Van Myers; Robert L. King

[57] ABSTRACT

An N-channel MOS high voltage detection circuit generates an output when an input voltage ($V_{in}$) exceeds a supply voltage ($V_{DD}$) by a desired offset voltage. The crossover detection is delayed by pumping more current into an output producing node via a lower resistance field effect transistor having a gate coupled to the input voltage. The output is finally produced when the effect of this transistor is overcome by a second field effect transistor. Switching characteristics may be sharpened by placing a voltage limiting field effect transistor between Vin and the gate of the low resistance field effect transistor.

10 Claims, 1 Drawing Figure

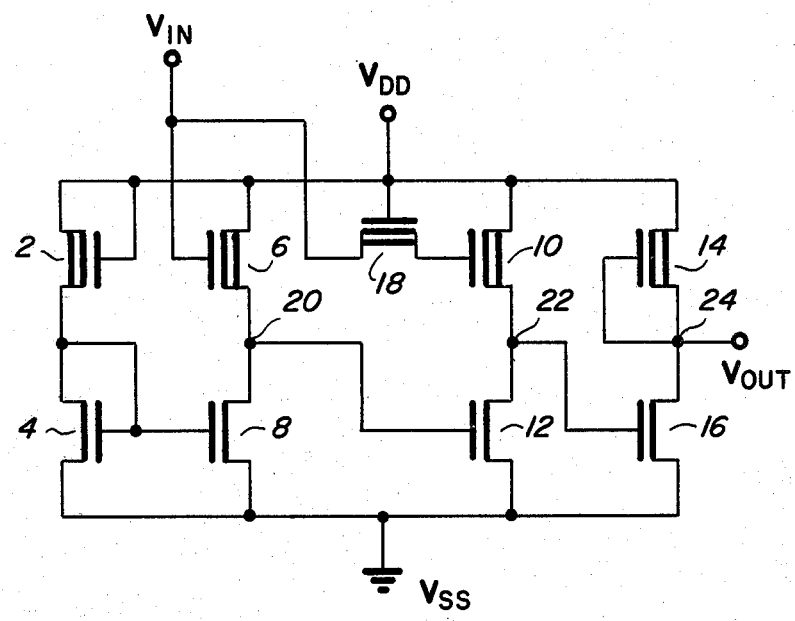

HIGH VOLTAGE DETECTION CIRCUIT

BACKGROUND OF THE INVENTION

1. Field of the Invention

This invention relates generally to voltage comparators and, more particularly, to a circuit for detecting when an input becomes greater than the supply voltage by predetermined offset voltage.

2. Description of the Prior Art

The advantages offered by MOS technology are well known; e.g. higher density, greater yield, etc. Thus, smaller MOS device geometries permit a greater number of devices to be produced per unit area or, stated another way, a single MOS device will occupy less space. This characteristic is extremely important in the design and fabrication of complex digital integrated circuits; for example, single chip microprocessors.

Whereas digital circuitry is generally characterized by its "ON/OFF" or "ONE/ZERO" nature, most measurements in the real world are inherently analog; e.g., temperature, pressure, speed, voltage, etc. Therefore, it is necessary that microprocessors and other digital circuitry communicate or interface with analog circuitry such as amplifiers, buffers, comparators, etc., in order to permit digital processing of the analog signals. The required interfacing may be accomplished by providing analog components which are external to the microprocessor chip. However, such arrangements generally require more current, a larger power supply and commonly present more opportunities for design and manufacturing errors. To avoid these disadvantages, analog circuits are being manufactured integrally with the digital circuitry; e.g., on the microprocessor chip itself, and due to the complex nature of microprocessors, the inclusion of analog devices on the same chip requires that the same manufacturing process be employed.

In some cases, it may be necessary to detect when the input voltage has exceeded the supply voltage in order to initiate certain circuit operations. For example, a microcomputer which normally functions with two voltage levels (zero and 5 volts) may include a feature whereby a self-test routine is initiated when the input voltage exceeds the supply voltage. However, this self-test feature should not be instigated until the input voltage has exceeded the supply voltage by some predetermined amount in order to avoid unwanted initiations close to the 5 volt level. That is, slight variations in the supply voltage should not be allowed to instigate the self-test feature.

Devices which detect equivalence of two voltages levels or the lack thereof are well-known. For example, a supply voltage and an input voltage could be applied to the inputs of a comparator which would then generate an output change when the two input voltages were equal. To avoid problems at the 5 volt level, an offset voltage could be added to the supply voltage; however, problems still arise due to the difficulty of maintaining the offset voltage constant. If the offset voltage should become too low, the trigger voltage could again reside in the 5 volt level.

Low ratio MOS inverters have also been used in attempt to achieve the desired results. However, it has been found that when using low ratio inverters, the switching point can vary from approximately 3 volts to approximately 20 volts, clearly an unsatisfactory solution.

SUMMARY OF THE INVENTION

It is an object of the present invention to provide an improved high voltage detection circuit. It is further object of the present invention to provide high voltage detection circuit utilizing a built-in offset voltage to avoid spurious detections.

It is still further object of the invention to provide a high voltage detection circuit which generates an output when an input voltage exceeds a supply voltage plus a predetermined offset voltage, which offset voltage remains substantially constant.

According to a broad aspect of the invention there is provided a detection circuit for generating an output when an input voltage exceeds a supply voltage by a predetermined amount, comprising: an input stage for receiving said input voltage and said supply voltage and for generating a first output signal when said input voltage reaches said supply voltage; and switching means coupled to said input stage for delaying said first output signal until said input voltage exceeds said supply voltage by said predetermined amount.

BRIEF DESCRIPTION OF THE DRAWINGS

The above and other objects, features and advantages of the invention will be more clearly understood from the following detailed description taken in conjunction with the accompanying drawing which is schematic diagram of the inventive high voltage detection circuit.

DESCRIPTION OF THE PREFERRED EMBODIMENT

The inventive high voltage detection circuit shown in the drawing is implemented preferably, but not necessarily, with N-channel MOS field effect transistors. The circuit comprises an input stage including depletion devices 2 and 6 and enhancement devices 4 and 8, an output inverter stage including depletion device 14 and enhancement device 16, an offset portion including depletion device 10 and enhancement device 12, and an optional voltage limiting depletion device 18. Each leg of the circuit with the exception of device 18 is coupled between a first source of potential VDD and a second source of potential VSS (ground for N-channel).

Depletion device 2 has a drain and gate coupled to VDD and has a source coupled to the drain of enhancement device 4 which is connected as a resistor. The source of enhancement device 4 is coupled to ground. This leg of the circuit establishes a bias potential at the gate of enhancement device 8. The gate of depletion device 6 is coupled to some input voltage Vin and its current conducting path is coupled between VDD and node 20. The current conducting path of enhancement device 8 is coupled between node 20 and ground.

The output inverter stage includes enhancement device 16 configured as a switch and depletion device 14 configured as a resistor. The output voltage Vout is taken from node 24 at the junction of device 16 and device 14.

The offset portion of the circuit includes depletion device 10 and enhancement device 12 which are coupled in series between VDD and ground. The junction of devices 10 and 12 (node 22) is coupled to the gate of device 16 in the inverter stage, and the gate of device 12 is driven by the potential at node 20.

Assume for the time being that the gate of depletion device 10 is coupled directly to Vin and that depletion device 10 is of the same size (i.e. exhibits the same resistance) as depletion device 6 in the input stage. If Vin is less than VDD (less than 5 volts) the voltage established at node 20 will appear inverted at node 22 since devices 8 and 12 are identical, devices 6 and 10 are identical, the gates of devices 6 and 10 are coupled to Vin and the drain of devices 6 and 10 are coupled to VDD. Since Vin is less than VDD, a low voltage appears at node 20, a high voltage appears at node 22 (since devices 10 and 12 form an inverter), and a low voltage will appear at node 24, the circuit output. As Vin increases with respect to VDD, depletion device 6 will begin conducting harder thus raising the voltage at node 20. At substantially the same time, the voltage at node 22 will start decreasing thus increasing the output voltage. Thus, there has resulted the type of operation which the inventive circuit seeks to avoid. That is, the output voltage (Vout) has switched when Vin is substantially equal to VDD.

To avoid this problem, device 10 is made to have a lower resistance than device 6. Thus, as Vin increases above VDD, device 10 will conduct more current tending to keep the voltage of node 22 up. This will continue until device 10 is overpowered by enhancement device 12 thus preventing the voltage at node 22 from going low until the input voltage exceeds VDD by some predetermined offset. This offset voltage is found to be approximately 2.2 volts with the following device dimensions:

| Device | Width/Length (Microns) |
| --- | --- |
| 2, 6, 18 | 6/20 |
| 4, 8, 12 | 50/8 |
| 14 | 8/8 |
| 16 | 70/6 |
| 10 | 6/10 |

In actuality, this offset voltage may vary from 2.2 volts to 2.6 volts; however, this variance is much improved over prior art techniques. At any rate, no switching will occur in the proximity of the 5 volt level.

To improve the switching characteristics of the circuit, a voltage limiter may be coupled between Vin and the gate of depletion device 10. This voltage limiter is shown as depletion device 18 having a drain coupled to Vin, a gate coupled to VDD and a source coupled to the gate of device 10. With this arrangement, the voltage at the gate of device 10 will not continue to increase as the Vin increases but will be clamped when the gate to source voltage of device 18 exceeds approximately −2 volts. At this point, device 18 shuts off clamping the gate voltage of device 10 to approximately 7 volts. In this manner, a sharper switching characteristic will occur at node 22 and therefore at output node 24.

The foregoing description of the inventive high voltage detection circuit is given by way of example only and is not intended to limit the scope of the appended claims. No attempt has been made to illustrate all possible embodiments of the invention but rather only to illustrate its principles in the best manner presently known to practice them. For example, the circuit may be implemented in NMOS, PMOS, CMOS, etc. These and other modifications of the present invention as may occur to one skilled in the art, are within the spirit and scope of the invention, and it is therefore intended that the invention include all such modifications and equivalents which fall within the scope of the appended claims.

We claim:

1. A detection circuit for generating an output when an input voltage exceeds a supply voltage by a predetermined amount, comprising:

an input stage for receiving said input voltage and said supply voltage, and for generating an enable signal when said input voltage exceeds said supply voltage; and switching means coupled to said input stage, for receiving said input voltage, said supply voltage and said enable signal, and for providing said output in response to said enable signal when said input voltage exceeds said supply voltage by said predetermined amount.

2. A detection circuit for generating an output when an input voltage exceeds a supply voltage by a predetermined amount, comprising:

an input stage for receiving said input voltage and said supply voltage, and for generating an enable signal when said input voltage exceeds said supply voltage; and switching means coupled to said input stage, for receiving said input voltage, said supply voltage and said enable signal, and for providing said output in response to said enable signal when said input voltage exceeds said supply voltage by said predetermined amount, comprising:

a first field effect transistor of the N-channel enhancement type having source, drain and gate electrodes, said gate electrode coupled to said enable signal and said source electrode coupled to a first potential; and a second field effect transistor of the N-channel depletion type having source, drain and gate electrodes, said gate electrode coupled to said input voltage, said source coupled to the drain electrode of said first field effect transistor, said output occurring at the junction of said first and second transistors.

3. A detection circuit according to claim 2 wherein said first field effect transistor is configured so as to oppose said first output signal at the source of said second transistor.

4. A detection circuit according to claim 3 wherein said first output signal drives said junction low and wherein said second transistor has a low resistance for supplying additional current to said junction.

5. A detection circuit according to claim 4 further including voltage limiting means coupled between said input voltage and said switching means.

6. A detection circuit according to claim 5 wherein said voltage limiting means comprises a third field effect transistor of the depletion type having a drain coupled to said input voltage, a gate coupled to said supply voltage and a source coupled to the gate of said second transistor for clamping the voltage at the gate of said second transistor as said input voltage rises.

7. A detection circuit according to claim 6 further including an inverter stage coupled to said switching stage for inverting the output at said junction.

8. A detection circuit according to claim 7 wherein said inverter comprises forth and fifth field effect transistors series coupled between said supply voltage and said first potential, said fifth transistor having a gate coupled to said junction.

9. A detection circuit according to claim 8 wherein said input stage includes sixth and seventh field effect transistors coupled in series between said supply voltage and said first potential for producing said first output signal at their junction, said sixth transistor having a gate coupled to said input voltage and said seventh transistor having a gate coupled to a second potential.

10. A detection circuit according to claim 9 wherein said sixth transistor has a greater resistance than said second transistor.

* * * * *